United States Patent [19]
Kasai et al.

[11] Patent Number: 5,646,437
[45] Date of Patent: *Jul. 8, 1997

[54] INDIUM ANTIMONIDE (INSB) PHOTODETECTOR DEVICE AND STRUCTURE FOR INFRARED, VISIBLE AND ULTRAVIOLET RADIATION

[75] Inventors: Ichiro Kasai, Solvang; John R. Toman, Santa Barbara, both of Calif.

[73] Assignee: Santa Barbara Research Center, Goleta, Calif.

[*] Notice: The portion of the term of this patent subsequent to Jun. 2, 2014, has been disclaimed.

[21] Appl. No.: 252,986

[22] Filed: Jun. 2, 1994

Related U.S. Application Data

[63] Continuation of Ser. No. 68,897, May 28, 1993, abandoned, which is a continuation-in-part of Ser. No. 742,248, Aug. 8, 1991, abandoned.

[51] Int. Cl.$^6$ ........................................ H01L 27/14
[52] U.S. Cl. ........................ 257/437; 257/441; 257/631
[58] Field of Search .............................. 257/437, 441, 257/289, 292, 631

[56] References Cited

U.S. PATENT DOCUMENTS

| | | |
|---|---|---|
| Re. 32,928 | 5/1989 | Jacob .................. 156/643 |
| 3,567,946 | 3/1971 | Paul . |
| 3,983,395 | 9/1976 | Kim . |
| 4,286,277 | 8/1981 | Longshore . |
| 4,371,587 | 2/1983 | Peters .................. 428/446 |
| 5,086,328 | 2/1992 | Kasai et al. . |
| 5,130,259 | 7/1992 | Bahraman ................. 437/5 |
| 5,262,633 | 11/1993 | Kasai et al. ............. 257/437 |

FOREIGN PATENT DOCUMENTS 63-150976  6/1988  Japan .

*Primary Examiner*—Sara W. Crane
*Assistant Examiner*—Courtney A. Bowers
*Attorney, Agent, or Firm*—W. C. Schubert; W. K. Denson-Low

[57] ABSTRACT

The light receiving or back-side surface (22) of an indium antimonide (InSb) photodetector device (10) substrate (12) is cleaned to remove all native oxides of indium and antimony therefrom. A passivation layer (26) is then formed on the surface (22) of a material such as silicon dioxide, silicon suboxide and/or silicon nitride which does not react with InSb to form a structure which would have carrier traps therein and cause flashing. The device (10) is capable of detecting radiation over a continuous spectral range including the infrared, visible and ultraviolet regions.

15 Claims, 1 Drawing Sheet

INDIUM ANTIMONIDE (INSB) PHOTODETECTOR DEVICE AND STRUCTURE FOR INFRARED, VISIBLE AND ULTRAVIOLET RADIATION

CROSS-REFERENCE TO RELATED APPLICATION

This is a continuation of application Ser. No. 08/068,897, filed on May 28, 1993, now abandoned, which is a continuation-in-part of application Ser. No. 07/742,248, entitled "VISIBLE AND INFRARED INDIUM ANTIMONIDE (InSb) PHOTODETECTOR WITH NON-FLASHING LIGHT RECEIVING SURFACE", filed Aug. 8, 1991, by Ichiro Kasai et al., now abandoned.

BACKGROUND OF THE INVENTION

1. Field of the Invention

The present invention relates to an indium antimonide (InSb) photodetector device and photosensitive structure having a passivated light receiving surface which eliminates degradation of photoresponse in the infrared region due to flashing and enables the device to detect radiation in a continuous spectral range including the infrared, visible and ultraviolet regions.

2. Description of the Related Art

Back-side illuminated InSb photodetector devices such as photodiode arrays have been conventionally used for detecting infrared light radiation in a wavelength range of approximately 1–5.5 micrometers. However, they have been unusable for detecting light in both the infrared and visible regions due to a "flashing" effect which is inherent in conventional back-side passivated/anti-reflection coated InSb devices.

A conventional passivation/anti-reflection coating is formed by anodization of the back-side, or light receiving surface of the photodetector device substrate as described in an article entitled "Formation and Properties of Anodic Oxide Films on Indium Antimonide", by T. Sakurai et al, Japanese Journal of Applied physics, vol. 7, no. 12, December 1968, pp. 1491–1496.

The anodized oxide layer is predominantly microcrystalline $In_2O_3$ and $Sb_2O_3$ with a high concentration of antimony located interstitially within the oxide film. The antimony ions which are located close to the oxide/InSb interface form carrier traps. The flashing is caused by hot electrons generated by photons of visible or ultraviolet light which are captured by these electron traps in the passivation layer. The trapped electrons suppress the infrared response by recombining with photogenerated minority carriers (holes) before they are collected in the semiconductor P-N junctions of the device.

The prior art approach to utilization of InSb photodetectors for detecting infrared radiation is to provide a filter which selectively prevents light of visible and ultraviolet wavelengths from reaching the device. This, of course, renders the device inoperative for detecting visible and ultraviolet light.

The $In_2O_3$ and $Sb_2O_3$ oxides, in addition to any other oxides which may be formed through reaction of indium and/or antimony with oxygen, are referred to as "native oxides". The invention disclosed in the related application overcomes the flashing problem by eliminating these native oxides and associated carrier traps from the light receiving surface of an InSb photodetector, thereby producing a photodetector device which is capable of detecting visible and infrared light in a wavelength range of approximately 0.6–5.5 micrometers.

An antireflection coating is formed over the passivation layer. Although these layers are successful in performing their intended functions, they prevent the device from detecting radiation of wavelengths shorter than approximately 0.6 micrometers.

SUMMARY OF THE INVENTION

In accordance with the present invention, the light receiving or back surface of an InSb photodetector device substrate is cleaned to remove all oxides of indium and antimony therefrom. A passivation layer having a thickness of approximately 50–150 Angstroms is then formed on the back surface of a material which does not react with InSb to form a structure which would have carrier traps therein and cause flashing. The passivation layer preferably includes silicon dioxide, silicon suboxide, silicon nitride or a combination thereof.

The photodetector device of the related application as described above includes, in addition to the structure of the present device, an antireflection coating formed on the passivation layer. The present invention is based on the discovery by the inventors that the device is capable of detecting radiation in a continuous spectral range of approximately 0.3–5.5 micrometers.

Since the antireflection coating which blocks radiation of wavelengths shorter than approximately 0.7 micrometers is not present, the present photodetector device is responsive to radiation in the short wavelength portion of the visible spectral region as well as radiation in the near ultraviolet region.

A focal plane array based on the present photodetector device can replace conventional arrays which include separate photodetectors for different spectral regions. This will enable substantial simplification and cost reduction of imaging systems using these arrays.

These and other features and advantages of the present invention will be apparent to those skilled in the art from the following detailed description, taken together with the accompanying drawings.

DETAILED DESCRIPTION OF THE INVENTION

Figure 1:
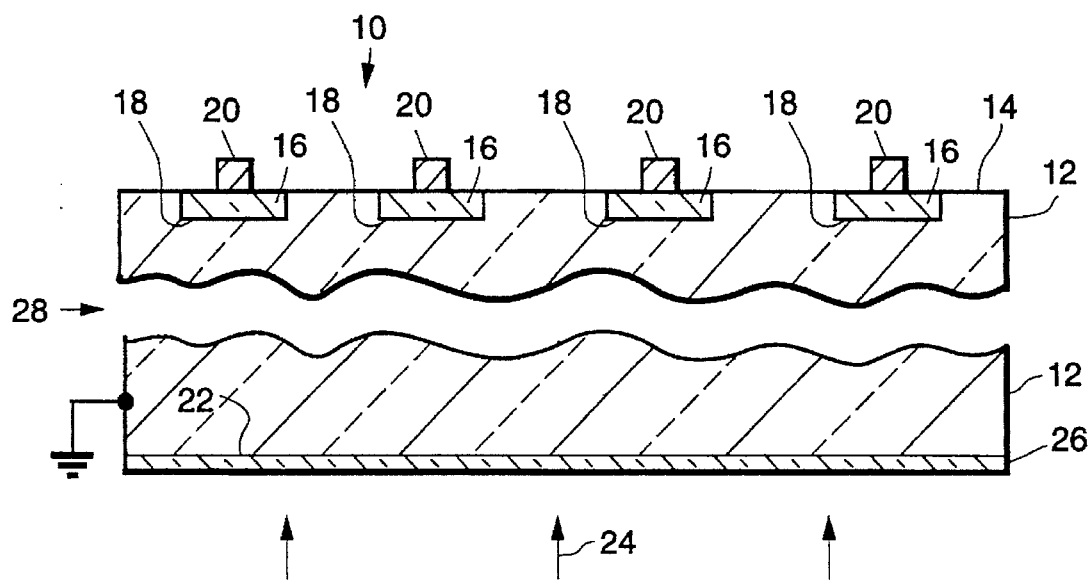
FIG. 1 is a simplified sectional view of a photodetector device including a photosensitive structure embodying the present invention.

As illustrated in FIG. 1, an InSb photodetector device embodying the present invention is generally designated as 10, and includes an InSb wafer or substrate 12 having a front surface 14 in which at least one photosensitive semiconductor junction is formed. The substrate 12 is typically lightly doped with an N type dopant such as tellurium. Heavily doped P+ type regions 16 are formed in the surface 14 through ion implantation of beryllium. Photosensitive semiconductor junctions 18 which constitute photodiodes are formed at the interfaces of the P+ regions 16 and the N-type substrate 12.

Ohmic contacts 20 are formed on the P+ regions 16. A complete circuit path for the photodiodes is provided by means which are symbolically indicated by connection of the substrate 12 to ground.

The substrate 12 has a back-side or light receiving back surface 22 which is designed to receive incident light for detection by the device 10 as indicated by arrows 24. The substrate 12 is thin enough (approximately 8–12 micrometers thick) for the photogenerated carriers to diffuse therethrough from beneath the surface 22 to the junctions 18 and cause carrier collection at the junctions 18.

During the fabrication process of the device 10, the surface 22 is thoroughly cleaned to remove all native oxides of indium and antimony therefrom. A passivation layer 26 is formed on the back surface 22 of a material which will not react with indium antimonide (InSb) to form either native oxides or any other substance or structure which would have carrier traps therein and cause flashing.

The passivation layer 26 is preferably formed of an silicon oxide and/or nitride material, although the scope of the invention is not so limited. The passivation layer 26 may be formed of any material which will not produce carrier traps when formed on the surface 22, will passivate the surface 22 by preventing reaction thereof with the ambient atmosphere, and is substantially transparent to infrared, visible and ultraviolet light in a continuous spectral range.

For the purposes of the present disclosure, the term "substantially transparent" means that the passivation layer 26 is sufficiently transparent to light within the selected wavelength range to enable the device 10 to provide useful operation. Although not illustrated, the scope of the invention further includes forming an anti-reflection coating over the passivation layer 26 of a material which is also substantially transparent to light in the selected wavelength range.

The passivation layer 26 may be formed using a conventional plasma deposition technique. The preferred materials for the layer 26 are silicon dioxide ($SiO_2$), silicon suboxide ($SiO_y$) where $0 \leq y \leq 2$, silicon nitride ($Si_3N_4$) or a combination or mixture thereof. The generic composition of these materials is $Si_xO_yN_z$, where $x=1$ or $3$, $0 \leq y \leq 2$ and $z=0$, $1$ or $4$.

Figure 2:
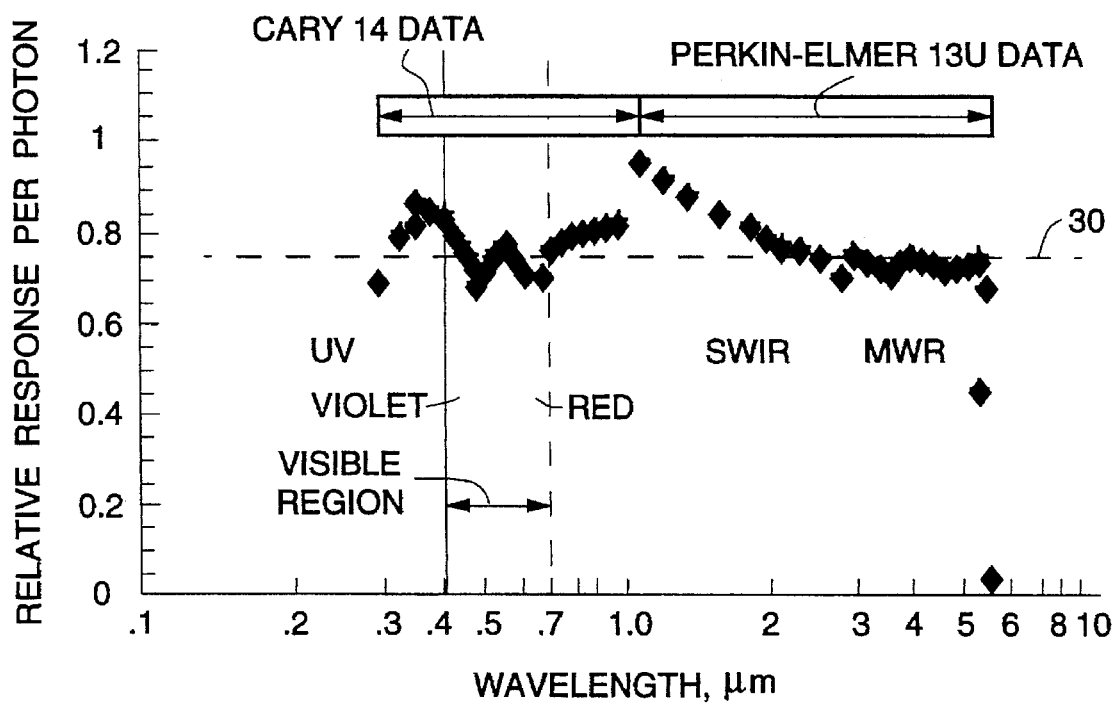
FIG. 2 is a graph illustrating the relative response per photon of the present photodetector device.

FIG. 2 illustrates the performance of the present photodetector device 10. The quantum efficiency of the device 10 in terms of the relative photoresponse per photon is plotted as a function of wavelength. A reference level as indicated by a broken line 30 corresponds to a quantum efficiency of 0.63 at a wavelength of 4.0 micrometers. It will be seen that the range of useful photoresponse extends continuously from approximately 0.3–5.5 micrometers, including the near ultraviolet (UV), visible, short wave infrared (SWIR) and medium wave infrared (MWIR) spectral regions.

The data for wavelengths shorter than 1.0 micrometer was taken with a Cary 14 spectrometer using a quartz-halogen light source. The data for wavelengths longer than 1.0 micrometer was taken with a Perkin-Elmer 13U prism monochromator. A discontinuity of approximately 10% exists at the 1.0 micrometer interface. However, the data is sufficiently accurate to demonstrate the useful photoresponse of the present device 10 in the infrared, visible and ultraviolet spectral regions.

EXAMPLE

Experimental photodetector devices which produced the results illustrated in FIG. 2 were fabricated using the following procedure.

(1) The P+ regions 16, contacts 20, and other associated elements were formed in the front side 14 of an InSb substrate or wafer 12 which was initially 750 micrometers thick to form operative photodiode junctions 18.

(2) The back side 22 was abraded until the thickness of the substrate 12 was reduced to approximately 15 micrometers.

(3) The front side 14 of the substrate 12 was mounted on a sapphire slide, and areas of the back side 22 except on which the passivation layer 26 was to be formed were protected with a thick coating of photoresist.

(4) The surface 22 was plasma ashed using oxygen plasma for 10 minutes at a pressure of 0.5 Torr and power of 150 W.

(5) The surface 22 was chemically etched using a two step process.

(a) 30 seconds in a 50/50 solution of hydrochloric acid/de-ionized water.

(b) 3 minutes in a 70/10 solution of lactic acid/nitric acid.

Steps (4) and (5) in combination cleaned the back surface 22 by removing the native oxides, crystal damage caused by the thinning process in step (2), and some of the InSb material, such that the final thickness of the substrate 12 was between approximately 8 to 12 micrometers.

(6) The substrate 12 was rinsed in a de-ionized water bath, and dried by $N_2$ gas flow. The following step of applying the passivation layer 26 was performed within a sufficiently short length of time that no appreciable native oxides were able to form on the surface 22 through exposure to the ambient atmosphere.

(7) The passivation layer 26 was formed on the surface 22 of the substrate 12 using conventional plasma deposition. The passivation layer 26 was a mixture of $SiO_2$ and $Si_3N_4$ and was formed from a plasma including $N_2$, $O_2$, and silane ($SiH_4$).

While an illustrative embodiment of the invention has been shown and described, numerous variations and alternate embodiments will occur to those skilled in the art, without departing from the spirit and scope of the invention.

For example, although the embodiment of the invention as described and illustrated includes an indium antimonide substrate and a silicon oxide or nitride passivation layer, the scope of the invention encompasses the use of other substrate materials such as mercury cadmium telluride (HgCdTe), as well as other materials for the passivation layer.

Accordingly, it is intended that the present invention not be limited solely to the specifically described illustrative embodiment. Various modifications are contemplated and can be made without departing from the spirit and scope of the invention as defined by the appended claims.

We claim:

1. A broadband photodetector device capable of detecting infrared (IR), visible and near-ultraviolet (UV) radiation, comprising:

a photosensitive substrate formed from a material that has a light receiving surface which is substantially free of native oxides of any components of the substrate material, and accordingly has substantially no carrier traps for electrons excited in the substrate by incident near-UV radiation;

a passivation layer formed on said substantially native oxide-free light receiving surface which does not react with the substrate to form a structure which would have carrier traps therein, said passivation layer being substantially transparent to a broadband spectrum that includes IR, visible and near-UV radiation components; and at least one photosensitive semiconductor junction formed in said substrate;

said detector responding to illumination of said light receiving surface with light over said broadband spectrum by generating electrons in the substrate in response to said near-UV radiation, and generating electron-hole pairs in response to the IR component, with said holes moving to said photosensitive junction without substantial interference from said near-UV generated electrons.

2. A device as in claim 1, in which:

the substrate comprises indium antimonide; and said native oxides of which said surface is substantially free comprise oxides of indium and antimony.

3. A device as in claim 2, in which the passivation layer is approximately 50–150 angstroms thick.

4. A device as in claim 2, in which the passivation layer comprises a material selected from the group consisting of silicon dioxide, silicon suboxide and silicon nitride.

5. A device as in claim 2, in which the passivation layer comprises silicon nitride and a material selected from the group consisting of silicon dioxide and silicon suboxide.

6. A device as in claim 2, in which the passivation layer comprises a material having the composition $Si_xO_yN_z$, where x=1 or 3, $0 \leq y \leq 2$ and z=0, 1 or 4.

7. A broadband photosensitive structure, comprising:

a photosensitive substrate formed from a material that has a light receiving surface which is substantially free of native oxides of any components of the substrate material, and accordingly has substantially no carrier traps for electrons excited in the substrate by incident near-ultraviolet (UV) radiation; and a passivation layer formed on said substantially native oxide-free light receiving surface which does not react with the substrate to form a structure which would have carrier traps therein and is substantially transparent to a broadband spectrum of radiation having infrared, visible and near-UV components;

said photosensitive structure responding to illumination of said light receiving surface with light over said broadband spectrum by generating electrons in the substrate in response to said near-UV radiation, and generating electron-hole pairs in response to the IR component, with said holes free to move across the substrate without substantial interference from said near-UV generated electrons.

8. A structure as in claim 7, in which:

the substrate comprises indium antimonide; and said native oxides of which said surface is substantially free comprise oxides of indium and antimony.

9. A structure as in claim 8, in which the passivation layer is approximately 50–150 angstroms thick.

10. A structure as in claim 8, in which the passivation layer comprises a material selected from the group consisting of silicon dioxide, silicon suboxide and silicon nitride.

11. A structure as in claim 8, in which the passivation layer comprises silicon nitride and a material selected from the group consisting of silicon dioxide and silicon suboxide.

12. A structure as in claim 8, in which the passivation layer comprises a material having the composition $Si_xO_yN_z$, where x=1 or 3, $0 \leq y \leq 2$ and z=0, 1 or 4.

13. A broadband photodetector device capable of detecting infrared (IR), visible and near-ultraviolet (UV) radiation, comprising:

an InSb substrate having a light receiving surface;

a $Si_3N_4$ passivation layer formed on said light receiving surface which does not react with the substrate to form a structure which would have carrier traps therein, said passivation layer being substantially transparent to a broadband spectrum that includes IR, visible and near-UV radiation components; and at least one photosensitive semiconductor junction formed in said substrate.

14. A device as in claim 13, in which the passivation layer is approximately 50–150 angstroms thick.

15. A broadband photosensitive structure, comprising:

a photosensitive InSb substrate having a light receiving surface; and a $Si_3N_4$ passivation layer, approximately 50–150 angstroms thick, formed on said light receiving surface which does not react with the substrate to form a structure which would have carrier traps therein and is substantially transparent to a broadband spectrum of radiation having infrared, visible and near UV components.

* * * * *